United States Patent
Tran et al.

(10) Patent No.: US 10,504,851 B2
(45) Date of Patent: Dec. 10, 2019

(54) STRUCTURE AND METHOD TO IMPROVE OVERLAY PERFORMANCE IN SEMICONDUCTOR DEVICES

(71) Applicant: GLOBALFOUNDRIES INC., Grand Cayman (KY)

(72) Inventors: Cung D. Tran, Niskayuna, NY (US); Huaxiang Li, Lenox, MA (US); Bradley Morgenfeld, Greenfield Center, NY (US); Xintuo Dai, Rexford, NY (US); Sanggil Bae, Clifton Park, NY (US); Rui Chen, Clifton Park, NY (US); Md Motasim Bellah, Malta, NY (US); Dongyue Yang, Lawrenceville, NJ (US); Minghao Tang, Ballston Lake, NY (US); Christian J. Ayala, Schenectady, NY (US); Ravi Prakash Srivastava, Clifton Park, NY (US); Kripa Nidhan Chauhan, Clifton Park, NY (US); Pavan Kumar Chinthamanipeta Sripadarao, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/904,853

(22) Filed: Feb. 26, 2018

(65) Prior Publication Data

US 2019/0267329 A1   Aug. 29, 2019

(51) Int. Cl.
*H01L 23/544* (2006.01)
*H01L 23/528* (2006.01)
(Continued)

(52) U.S. Cl.
CPC .............. *H01L 23/544* (2013.01); *G03F 7/16* (2013.01); *G03F 9/708* (2013.01); *G03F 9/7076* (2013.01);
(Continued)

(58) Field of Classification Search
CPC ................. H01L 23/544; H01L 23/528; H01L 2223/54426; G03F 9/7076; G03F 9/708;
(Continued)

(56) References Cited

U.S. PATENT DOCUMENTS

| 6,118,185 A | 9/2000 | Chen et al. |
| 6,819,426 B2 * | 11/2004 | Sezginer ............. G03F 7/70633 356/400 |

(Continued)

FOREIGN PATENT DOCUMENTS

WO    2015066040 A1    5/2015

*Primary Examiner* — Mohsen Ahmadi
(74) *Attorney, Agent, or Firm* — Gibb & Riley, LLC; Anthony J. Canale

(57) ABSTRACT

In an exemplary method, a first layer is formed on a substrate. First overlay marks are formed in a first zone of the first layer. A non-transparent layer is formed on top of the first layer. At least a portion of the non-transparent layer is removed from an area above the first zone of the first layer. This provides optical access to the first overlay marks. A second layer is formed on top of the non-transparent layer. Second overlay marks are formed in a second zone of the second layer. Position information is obtained from each of the first overlay marks and the second overlay marks.

20 Claims, 12 Drawing Sheets

(51) Int. Cl.
  *H01L 21/027* (2006.01)
  *G03F 7/16* (2006.01)
  *G03F 7/20* (2006.01)
  *G03F 9/00* (2006.01)

(52) U.S. Cl.
  CPC .......... *G03F 9/7084* (2013.01); *G03F 9/7088* (2013.01); *H01L 21/0274* (2013.01); *G03F 7/70633* (2013.01); *G03F 7/70683* (2013.01); *H01L 23/528* (2013.01); *H01L 2223/54426* (2013.01)

(58) Field of Classification Search
  CPC . G03F 9/7084; G03F 7/70633; G03F 7/70683
  See application file for complete search history.

(56) References Cited

U.S. PATENT DOCUMENTS

| | | | |
|---|---|---|---|
| 6,888,260 B2 | 5/2005 | Carpi et al. | |
| 7,180,593 B2 | 2/2007 | Lin | |
| 7,414,279 B2 | 8/2008 | Park | |
| 7,666,559 B2* | 2/2010 | Schulz | G03F 7/70633 257/48 |
| 7,667,842 B2 | 2/2010 | Schulz | |
| 7,732,279 B2 | 6/2010 | Park | |
| 8,514,374 B2 | 8/2013 | Bailey et al. | |
| 9,059,037 B2 | 6/2015 | Barash et al. | |
| 9,311,443 B2 | 4/2016 | Chidambarrao et al. | |
| 9,329,495 B2 | 5/2016 | Dai et al. | |
| 9,490,217 B1 | 11/2016 | Lin et al. | |
| 9,646,865 B1* | 5/2017 | Zhang | G03F 9/7015 |
| 9,673,056 B2 | 6/2017 | Leobandung et al. | |
| 2003/0026471 A1* | 2/2003 | Adel | G03F 7/70633 382/144 |
| 2005/0157297 A1* | 7/2005 | Abdulhalim | G03F 7/70633 356/401 |
| 2005/0276465 A1 | 12/2005 | Chen | |
| 2005/0286052 A1* | 12/2005 | Huggins | G03F 9/7076 356/401 |
| 2006/0024850 A1 | 2/2006 | Monahan et al. | |
| 2007/0076205 A1* | 4/2007 | Schulz | G03F 7/70633 356/401 |
| 2009/0004879 A1* | 1/2009 | Li | G03F 9/7046 438/761 |
| 2009/0004880 A1* | 1/2009 | Li | G03F 1/42 438/761 |
| 2012/0049186 A1* | 3/2012 | Li | G03F 9/7084 257/48 |
| 2012/0146159 A1 | 6/2012 | Wang et al. | |
| 2014/0030867 A1* | 1/2014 | Kim | H01L 21/027 438/401 |
| 2014/0167297 A1* | 6/2014 | Tsai | H01L 23/544 257/797 |
| 2015/0076653 A1 | 3/2015 | Hu et al. | |
| 2016/0126184 A1 | 5/2016 | Myers et al. | |
| 2016/0343774 A1* | 11/2016 | Or-Bach | H01L 27/2436 |
| 2017/0207097 A1 | 7/2017 | Leobandung et al. | |

\* cited by examiner

STRUCTURE AND METHOD TO IMPROVE OVERLAY PERFORMANCE IN SEMICONDUCTOR DEVICES

BACKGROUND

The present disclosure relates to semiconductor device fabrication, and, more specifically, to methods of forming semiconductor devices using overlay marks in forming and patterning stacked material layers used for fabricating structural features.

Fabrication of integrated circuits generally requires the formation of multiple integrated circuit patterns on one or more layers over a substrate wafer. These patterns generally include numerous regions of micro-structures or nano-structures that are formed through photolithography. Photolithography is a commonly used technique in the manufacture of semiconductor devices. The process uses patterns to define regions on a substrate. More specifically, with photolithography, a photoresist layer may be formed on a substrate, such as a silicon wafer, and then the resist layer is covered with a mask containing a pattern. The mask is exposed to radiation, such as ultraviolet light (UV), which is transmitted through transparent areas of the mask to cause a chemical reaction in corresponding regions of the photoresist. In other words, in the course of processing integrated circuits and the like in semiconductor devices, a standard sequence may involve putting down a layer of material, depositing a layer of photoresist on the layer of material, patterning the photoresist by projecting a pattern on it, and developing the resist to produce a pattern of open areas that expose the underlying material, with the other areas of the material still covered by the resist. Depending on whether a positive or negative tone resist is used, the exposed or unexposed portions of the photoresist layer are removed. The portions not protected by the photoresist are then etched to form the features in the substrate.

The relative positioning and alignment, or "overlay," between such fields is an important component of ensuring the functionality of the resultant integrated circuit, and as such minimizing overlay errors is a significant concern in the manufacturing of the structures of the integrated circuits. Overlay metrology is one way to monitor overlay alignment and minimize overlay errors. To facilitate alignment, overlay marks are formed on the wafer and reticle. This process generally forms alignment marks, referred to herein as overlay marks, in the same layer as the functional circuit structure fields that correspond to the overlay marks. The overlay marks may include different patterns that may then be scanned and/or imaged by an overlay metrology tool. The overlay marks generate a diffraction pattern when scanned by an alignment source from an alignment system. The metrology patterns of any two fields or layers can be measured and compared to determine their relative positions, with deviations in the overlay of the target patterns generally corresponding to deviations in the overlay between the circuit structure fields. Many different types of overlay metrology patterns have been developed to improve the accuracy of overlay metrology measurements.

Advancing technology continues to make smaller structures in integrated circuit (IC) devices. The complexity of advancing technology processes has put a heavy burden on lithography control parameters such as overlay for multiple layers. Advances in overlay target design and metrology has enabled significant improvement in overlay precision and accuracy, but still shows limitation. As structures are being created in the nano-scale size, lithography processes may be unable to maintain overlay requirements due to film stack complexity, weak contrast signals from the overlay marks due to nontransparent films, and/or imbalance of the contrast signals from the overlay marks. Having an overlay out of specification may result in open circuits or shorts in the structures, which not only impacts wafer/die yield but also impacts process throughput due to the necessity to rework the device.

SUMMARY

According to devices and methods herein, an advanced overlay mark target design is disclosed that provides non-transparent film removal only at a first area designated as the inner overlay mark area. This method vastly improves contrast signals for the overlay marks. The disclosed process integration may be used to remove a portion of non-transparent film at the designated overlay mark area and does not disturb downstream processes. The combination of advanced mark design and process integration enables more precise overlay control between layers and further improves device yield, performance, and lifetime reliability. According to devices and methods herein, the contrast intensity on either the first (inner) overlay marks or the second (outer) overlay marks can be selectively tuned by controlling the material thickness of the non-transparent film using either a partial removal process or a complete remove process. This provides contrast balance between the first overlay marks, sometimes referred to as the inner overlay marks, and the second overlay marks, sometimes referred to as the outer overlay marks. This method can be applied to any opaque film in order to improve overlay signals, which will reduce rework and improve process throughput.

According to an exemplary method herein, a first layer of a multilayer device is formed on a substrate. First overlay marks are formed in a first zone of the first layer. A non-transparent layer is formed on top of the first layer. A window is formed in the non-transparent layer by removing at least a portion of material from a preselected area of the non-transparent layer. The preselected area is vertically aligned on the first zone of the first layer so that the window provides optical access to the first overlay marks. A second layer is formed on top of the non-transparent layer and the window. Second overlay marks are formed in a second zone of the second layer. The first overlay marks and the second overlay marks are formed in two zones. The two zones include a first zone having first overlay marks and a second zone having second overlay marks. There may be intermediate layers between the first layer and the second layer. A portion of one of the intermediate layers, which is between the first layer having the first overlay marks and the second layer having the second overlay marks, is removed in only the first zone. This provides optical access to the first overlay marks. Position information is obtained from each of the first overlay marks and the second overlay marks.

According to other exemplary methods herein, a substrate having a top surface and a bottom surface is provided. A first layer is deposited on the top surface of the substrate. The first layer has a top surface and a bottom surface, and the bottom surface of the first layer contacts the top surface of the substrate. First overlay marks are formed in a zone of the first layer. A non-transparent layer is formed on top of the first layer. The non-transparent layer has a top surface and a bottom surface, and the bottom surface of the non-transparent layer contacts the top surface of the first layer. A portion of the non-transparent layer is selectively removed from an area above the zone of the first layer. This provides optical access to the first overlay marks. A second layer is formed on top of the non-transparent layer. The second layer has a top surface and a bottom surface, and the bottom surface of the second layer contacts the top surface of the non-transparent layer. Second overlay marks are formed in the second layer. The first overlay marks and the second overlay marks are used to align structural features on the substrate by balancing optical contrast intensity between the first overlay marks and the second overlay marks.

According to additional exemplary methods herein, a stacked structure is formed in a predefined area of a substrate. The substrate is the kind usable for fabricating semiconductor devices. The stacked structure includes a first layer of material having first overlay marks in a first zone of the first layer. A second layer of material is formed on top of the first layer of material. The second layer of material is a non-transparent material that covers the first zone. A patterned photoresist is formed on the second layer of material on top of a preselected portion of the first zone. A portion of the second layer of material is selectively removed from the area above the first zone that is not protected by the patterned photoresist. An etching process is used to remove the portion of the second layer of material. A third layer of material having second overlay marks in a second zone of the third layer of material is formed on top of the second layer of material. Position information is obtained from each of the first overlay marks and the second overlay marks. An overlay accuracy of structural features formed above the substrate outside of the predefined measurement area is determined based upon the obtained position information.

Exemplary structures include a substrate having a top surface and a bottom surface. A first layer is on the top surface of the substrate. The first layer has a top surface and a bottom surface. The bottom surface of the first layer contacts the top surface of the substrate. First overlay marks are located in a first zone of the first layer. A non-transparent layer is on top of the first layer. The non-transparent layer has a top surface and a bottom surface. The bottom surface of the non-transparent layer contacts the top surface of the first layer. A window is located in a preselected area of the non-transparent layer. The preselected area is vertically aligned on the first overlay marks. A second layer is on top of the non-transparent layer. The second layer has a top surface and a bottom surface. The bottom surface of the second layer contacts the top surface of the non-transparent layer. Second overlay marks are located in a second zone of the second layer. The first overlay marks and the second overlay marks provide position information for structural features on the substrate.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
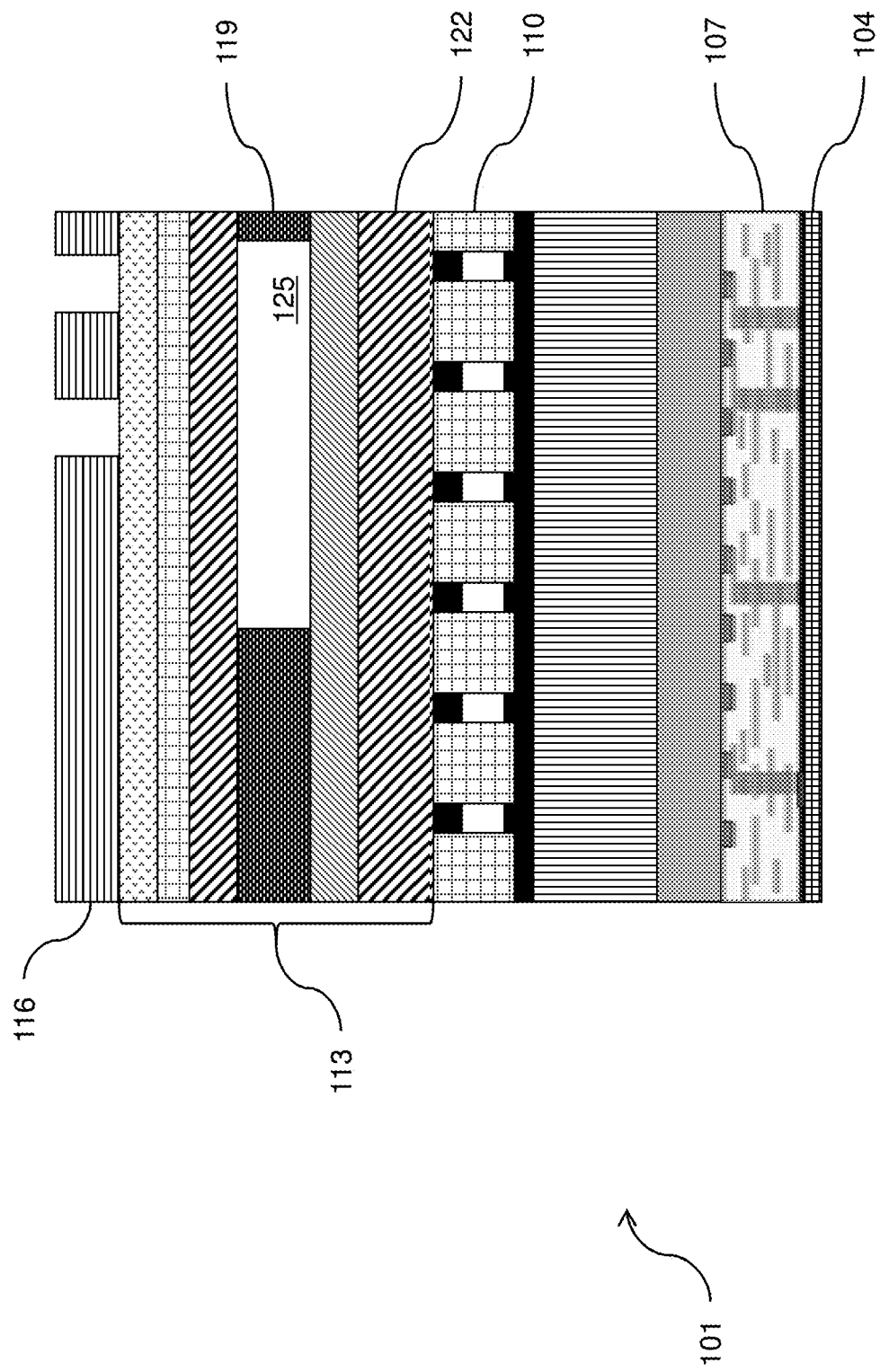
FIG. 1 is a cross-section view of a multi-layer structure according to devices and methods herein.

The disclosure will now be described with reference to a process to improve overlay performance during processing of a semiconductor wafer. While the disclosure will be described hereinafter in connection with specific devices and methods thereof, it will be understood that limiting the disclosure to such specific devices and methods is not intended. On the contrary, it is intended to cover all alternatives, modifications, and equivalents as may be included within the spirit and scope of the disclosure as defined by the appended claims.

For a general understanding of the features of the disclosure, reference is made to the drawings. The drawings are not to scale; however, in the drawings, like reference numerals have been used throughout to identify identical elements.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims but is merely representative of selected devices and methods. The following description is intended only by way of example, and simply illustrates certain concepts of the devices and methods, as disclosed and claimed herein.

The fabrication of an integrated circuit (IC) typically involves the formation of features on a substrate that make up circuit components, such as transistors, resistors and capacitors, and the interconnection of such components. To form the features, layers are repeatedly deposited on the substrate and patterned as desired. A plurality of ICs may be formed on a semiconductor substrate, such as a silicon wafer, in parallel.

During fabrication, a substrate or wafer may be processed through numerous procedures to create semiconductor devices. One such procedure may be thermal processing of the substrate. The substrate experiences thermal processing in order to activate dopant atoms implanted in regions of the substrate, for example, source and drain regions, with minimal dopant diffusion. The dopants may be used to designate the conductive characteristics of the wafer to either an n-type or p-type silicon.

Another such procedure is lithography, for example, photolithography. The substrate is processed using photolithography to transfer patterns or images for the circuit elements of the device onto the wafer using one or more masks.

As described above, to ensure that the features are formed in the desired location on the wafer, the various layers fields need to be properly aligned. To facilitate alignment, overlay marks are formed on the wafer. The overlay marks generate a diffraction pattern when scanned by an alignment source from an alignment system. Typically, the alignment source is part of the lithographic tool. The diffraction pattern is reflected and sensed by an alignment sensor that records the position of the overlay marks. As used herein, a first set of overlay marks is sometimes referred to as the inner overlay marks and a second set of overlay marks is sometimes referred to as the outer overlay marks.

Semiconductor device fabrication is typically a multiple step sequence of photolithographic and chemical processing steps during which electronic circuits are gradually created on a wafer made of semiconducting material. Etching may be used to remove layers from the surface of a wafer and to form trenches in the wafer during manufacturing. Etching, in conjunction with lithographic techniques, may be used to attack certain areas of a semiconductor surface in order to form recesses in the material or to otherwise remove portions of semiconductor layers. For many etching steps, part of the wafer is protected from the etchant by a masking material that resists etching.

For electronic applications, semiconducting substrates, such as silicon wafers, can be used. The substrate enables easy handling of the micro device through the many fabrication steps. Often many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithographic steps, oxidation steps, etching steps, doping steps, and many other steps performed. The complexity of microfabrication processes can be described by their mask count.

Optical lithography typically uses light against a photoresist. A photoresist is a light-sensitive material used to selectively expose a layer of material on a substrate. There are two types of photoresists. Positive photoresist, the most common type, becomes soluble in the basic developer when exposed; negative photoresist becomes insoluble in the developer. This chemical change allows some of the photoresist to be removed by a special solution, called "developer" by analogy with photographic developer. In other words, a positive resist is a type of photoresist in which the portion of the photoresist that is exposed to light becomes soluble to the photoresist developer. The portion of the photoresist that is unexposed remains insoluble to the photoresist developer. A negative resist is a type of photoresist in which the portion of the photoresist that is exposed to light becomes insoluble to the photoresist developer. The unexposed portion of the photoresist is dissolved by the photoresist developer.

During a process flow for fabricating an IC, numerous lithographic steps are required. Overlay measurements are typically performed to verify alignment of the different layers. Alignment or overlay marks are formed on the different layers to facilitate overlay measurements in which the relative positions of the overlay marks on the different layers are determined. The sets of overlay marks are positioned such that they overlay each other if the layers are properly aligned.

Advantageously, the methods disclosed herein may improve the functioning of the electrical circuits by improving the positioning of the various structures and may reduce the number of wafers that are discarded due to misalignment of layers. In addition, the methods disclosed herein may remove the need for rework, which may, for example, reduce device costs, shorten cycle time, and improve device yield.

Now, referring to the drawings, FIG. 1 shows an exemplary multi-layer stack, indicated generally as 101, according to devices and methods herein. The multi-layer stack 101 may include a substrate 104. The substrate 104 may be any conventional semiconductor substrate such as, for example, a bulk silicon substrate or an active layer of semiconductor material of a silicon-on-insulator (SOI). One or more functional layers 107 may be formed on the substrate 104. The multi-layer stack 101 may include a first layer 110 having first (inner) overlay marks, a plurality of intermediate layers, indicated as 113, and a second layer 116 having second (outer) overlay marks. The plurality of intermediate layers 113 may further include one or more metallization layers 119 and dielectric layers 122. The metallization layers 119 can be, for example, copper (Cu), aluminum (Al), tungsten (W), cobalt (Co), etc., and nitrides of such metals, such as, titanium nitride (TiN). The dielectric layers 122 can be, for example, silicon oxide, a nitride, or any other suitable interlayer dielectric (ILD) material (e.g., borophosphosilicate glass (BPSG), tetraethyl orthosilicate (TEOS), fluorinated tetraethyl orthosilicate (FTEOS), etc.). Any of the various layers may include overlay marks for aligning features of subsequent layers, as described in further detail below. It should be recognized that any or all layers of the multi-layer stack 101 might include overlay marks. According to devices and methods herein, a window 125 may be formed in a metallization layer 119 in the plurality of intermediate layers 113 to provide optical access to the inner overlay marks on the first layer 110.

Figure 2:
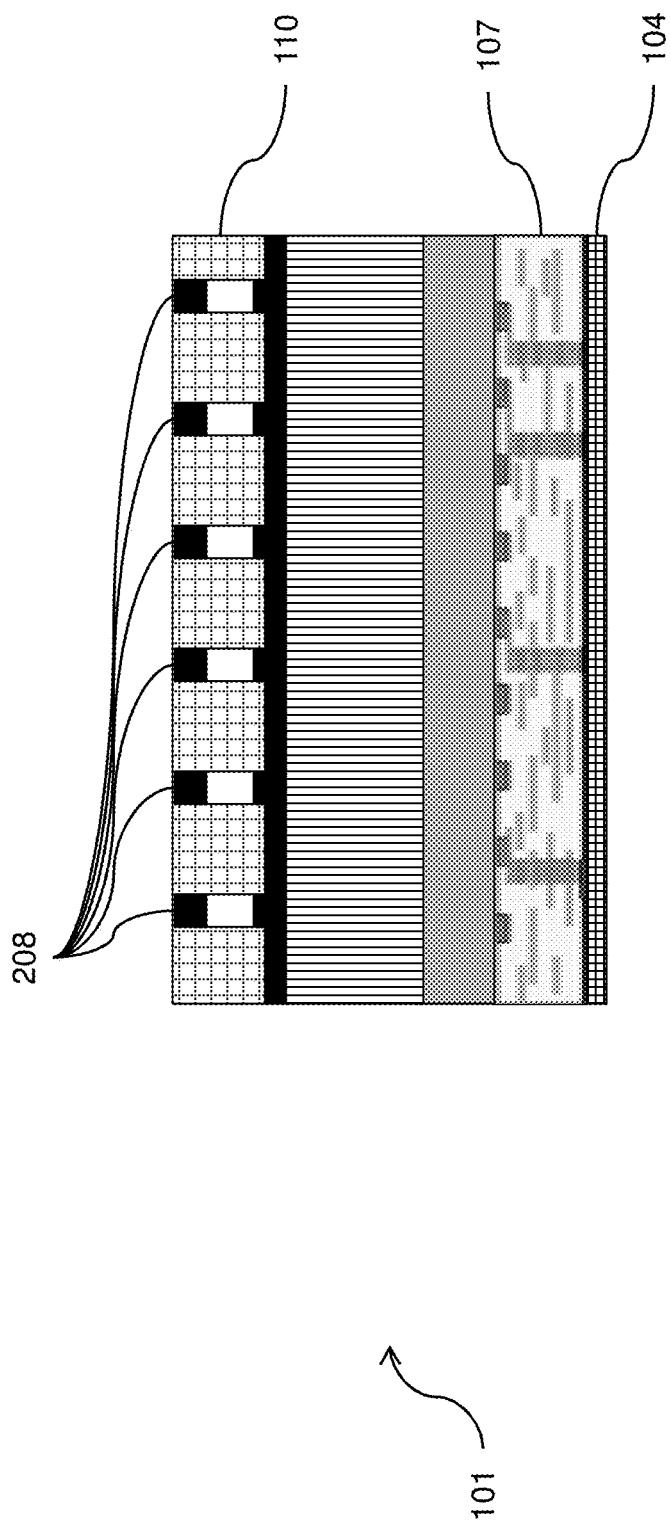
FIGS. 2-9 show a cross-section view of the multi-layer structure illustrating processing steps according to devices and methods herein.

FIGS. 2-9 show a cross-section view of the multi-layer stack 101 illustrating processing steps for forming the overlay marks, according to devices and methods herein. The overlay marks are sometimes known as advanced imaging metrology (AIM) marks, which are increasingly used to enhance overlay metrology reliability. AIM marks exhibit a periodic structure, thereby enabling utilization of highly powerful metrology techniques. The overlay marks may be of different types having different sizes and/or shapes and may be made of different materials. Increased performance of the overlay metrology may be obtained by using periodic overlay marks. Referring to FIG. 2, after the one or more functional layers 107 has been formed on the substrate 104, a first layer 110 having first (inner) overlay marks 208 may be formed in the multi-layer stack 101.

Figure 3:
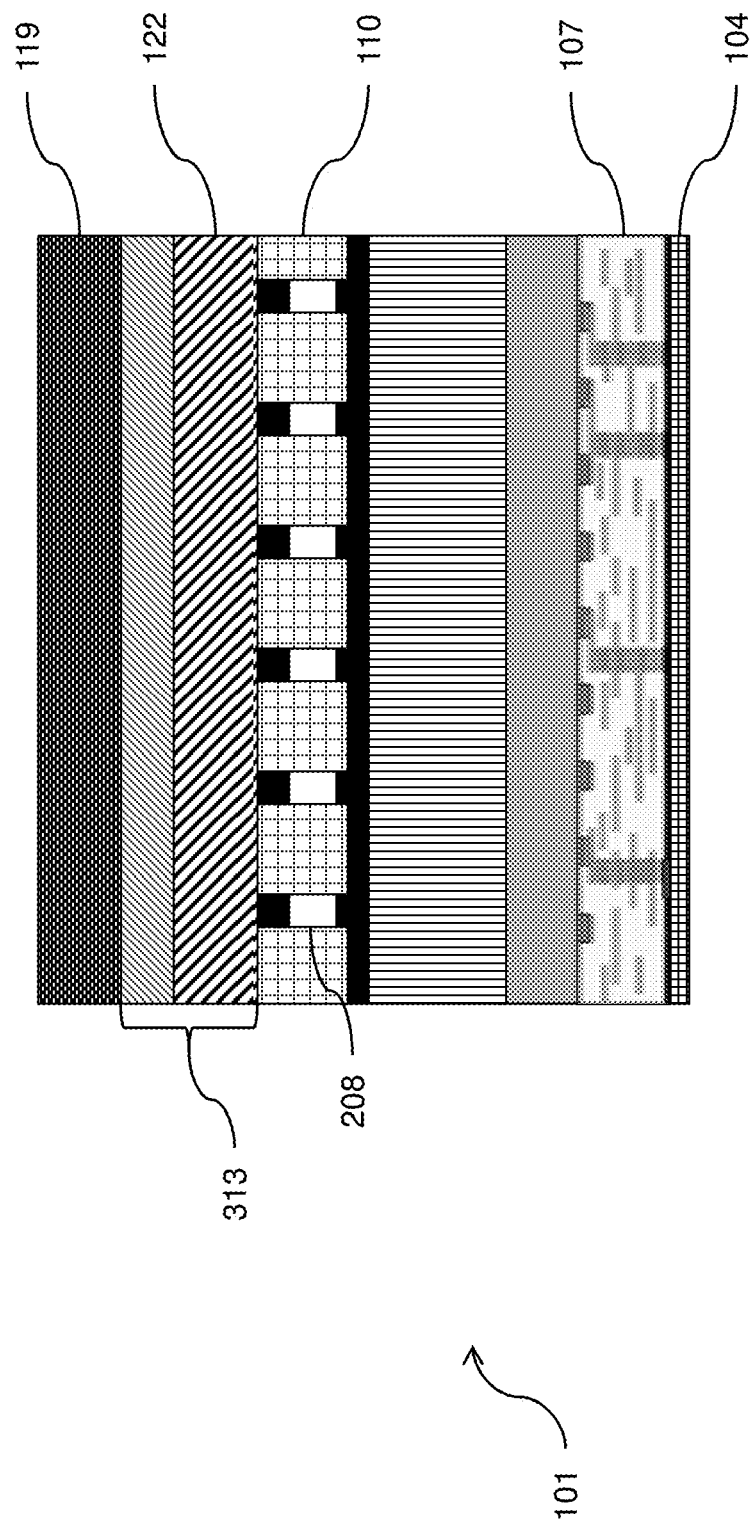

In FIG. 3, one of more first intermediate layers 313 are formed or deposited on the first layer 110. The intermediate layers 313 may include one or more dielectric layers 122. A non-transparent layer, such as metallization layer 119, is formed or deposited on the first intermediate layers 313.

Figure 4:
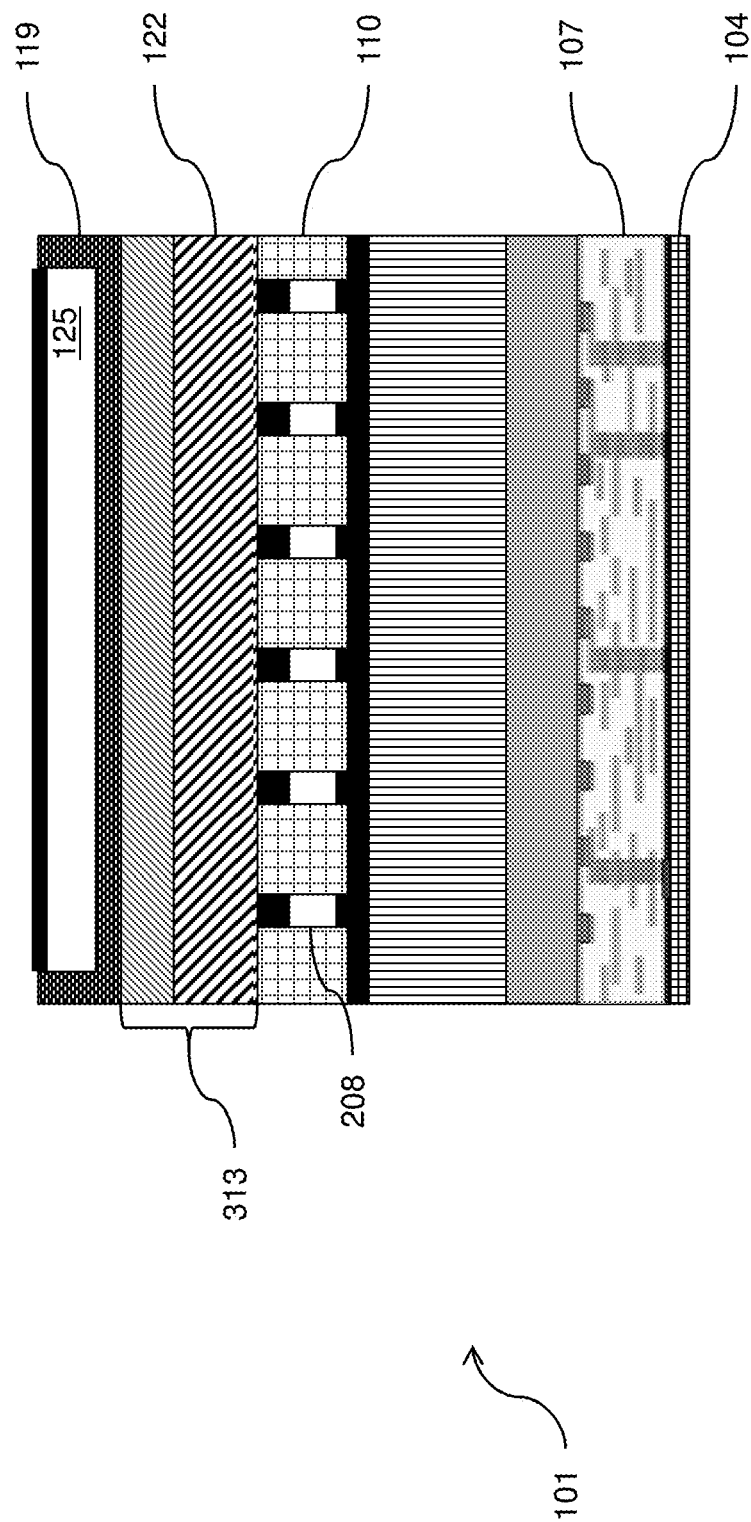
Figure 5:
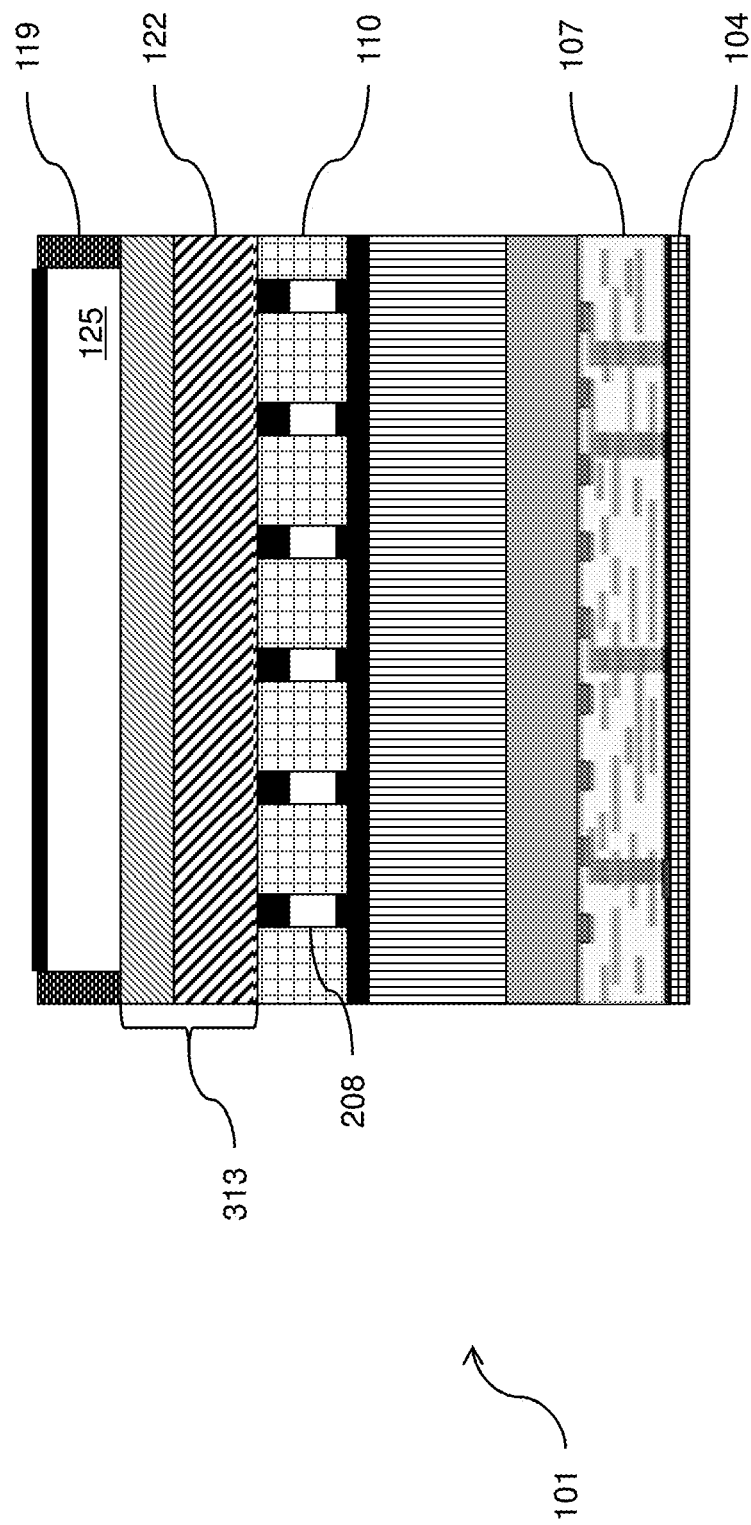
Figure 6:
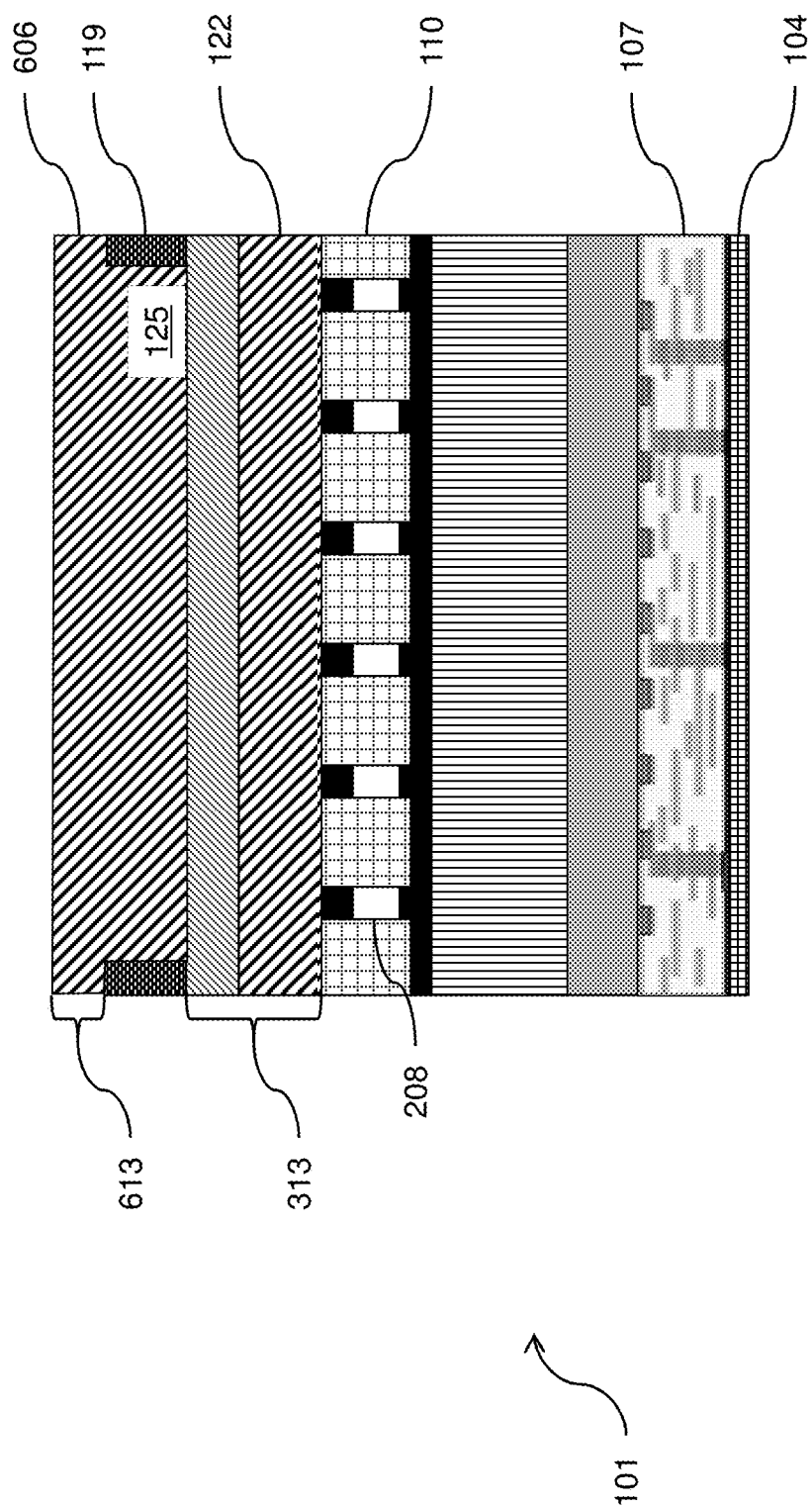

In FIG. 4, a window 125 is formed in the metallization layer 119 by removal of a portion of the metallization layer 119. The window 125 is located in an area above the inner overlay marks 208 to provide optical access to the inner overlay marks 208. In FIG. 4, only a portion of the metallization layer is removed to reduce the material thickness of the metallization layer 119. In FIG. 5, the window 125 is formed in the metallization layer 119 by a complete removal of the metallization layer 119 in the area above the inner overlay marks 208.

In a specific example, the metallization layer 119 may be a film of titanium nitride (TiN). A lithographic process may be performed on the TiN film. The process may include an initial pre-cleaning of the area where the lithography will be performed. Then a pattern is formed in the selected area. Etching is performed to remove part or all of the TiN film under overlay mark areas ONLY. As would be known to one of ordinary skill in the art, post etch ashing and cleaning may then be performed.

Figure 7:
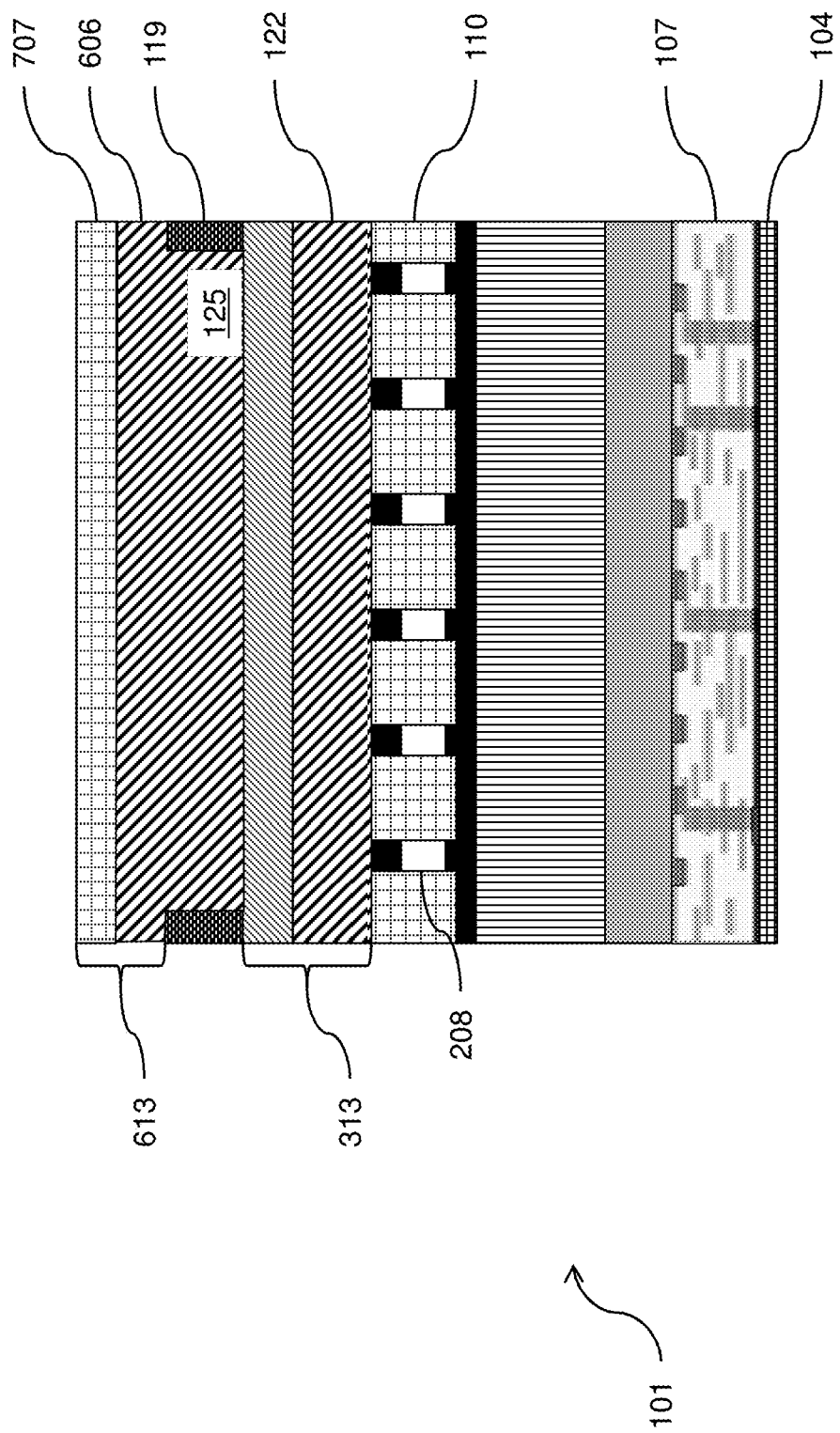
Figure 8:
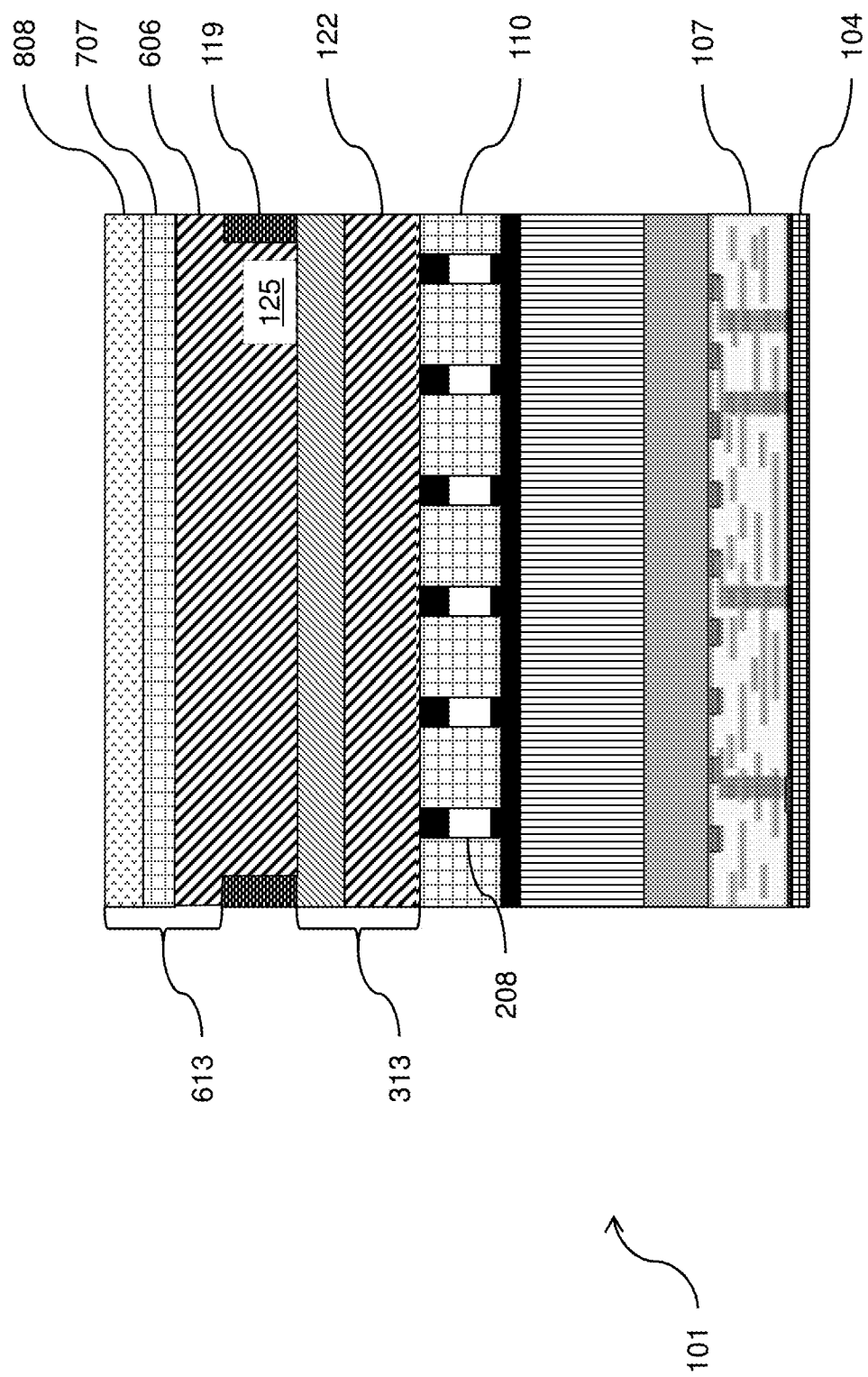
Figure 9:
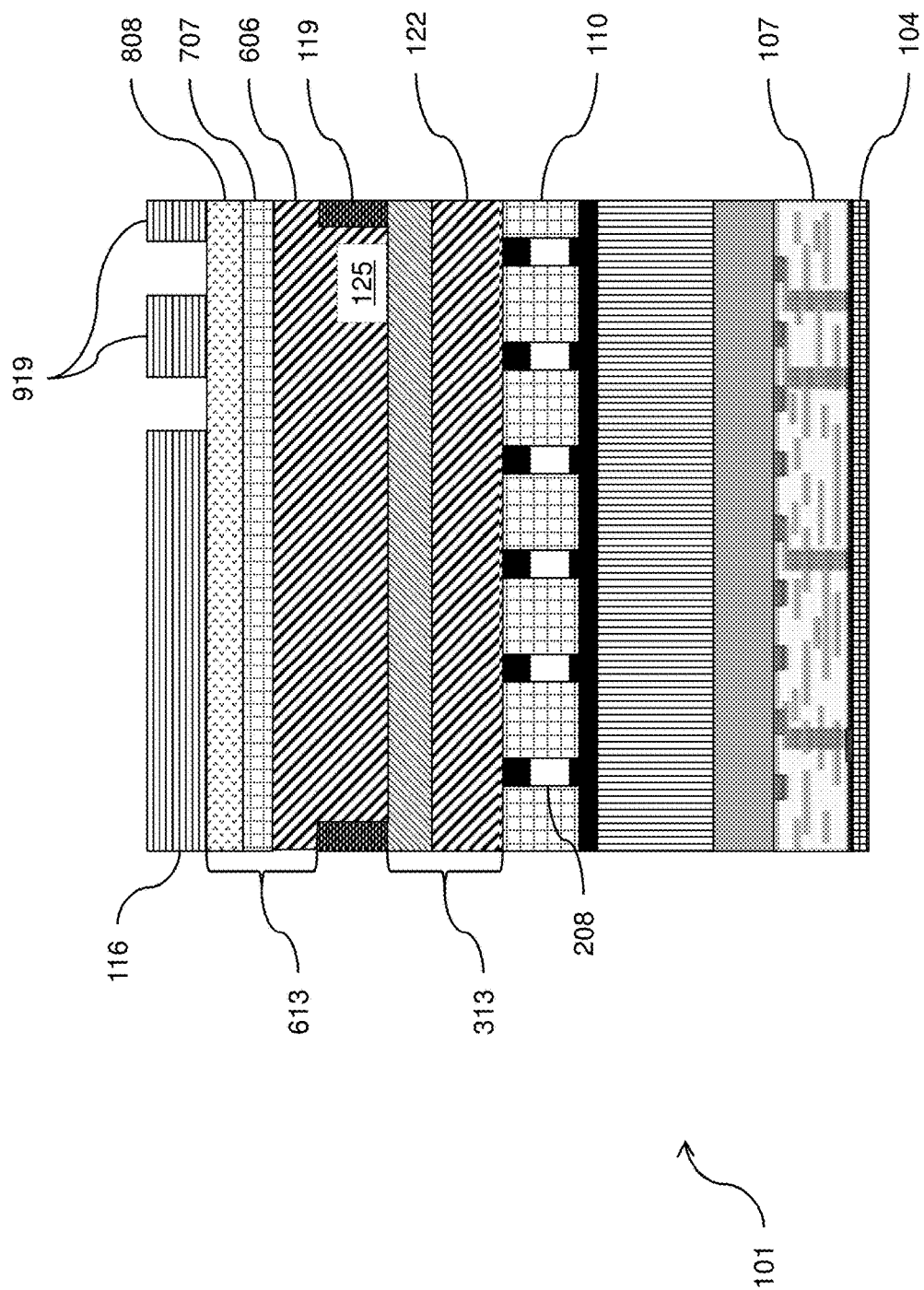

As described herein, the process is particularly useful in back end of line (BEOL) processing; however, this method can be applied to any opaque film to improve overlay signals. FIGS. 6-9 show a cross-section view of the multi-layer structure illustrating additional BEOL processing steps. Following complete removal of a portion of the TiN film of the metallization layer 119, one of more second intermediate layers 613 are formed or deposited on the metallization layer 119. For example, an SOH layer 606 can be formed or deposited on the metallization layer 119. As shown in FIG. 7, a low temperature oxide (LTO) layer 707 may be formed on the SOH layer 606. The LTO layer 707 may be any interlayer dielectric, as described above. As would be known by one of ordinary skill in the art, the multi-layer stack 101 may include a bottom anti-reflection coating (BARC) layer 808, as shown in FIG. 8. Then, as shown in FIG. 9, the second layer 116 having second (outer) overlay marks 919 may be formed over the BARC layer 808.

The window 125 may be formed in any layer between the first layer 110 having first (inner) overlay marks 208 and the second layer 116 having second (outer) overlay marks 919. That is, the window 125 may be formed in any layer of the intermediate layers 313 using either a partial removal process or a complete remove process in order to improve overlay signals.

The patterning process for forming structural features in two or more subsequent device layers may depend on pattern density, feature size, and the like, so that a significant discrepancy may be produced in overlay alignment. With decreasing sizes of features on the substrate, however, a discrepancy between overlay characteristics within a single die and the significantly larger structures of the overlay marks may be observed, thereby rendering obtained measurement data less reliable. In particular, a metallization layer 119 that is formed on the multi-layer stack 101 typically will be non-transparent, which makes optical alignment through the metallization layer 119 more difficult. The lithographic processes may be unable to maintain overlay requirements due to the complexity of the multi-layer stack 101, weak contrast signals between the inner overlay marks 208 and the outer overlay marks 919 due to non-transparent films, and/or imbalance of the contrast signals from the inner overlay marks 208 and the outer overlay marks 919.

The combination of the patterns of the inner overlay marks 208 on the first layer 110 and the outer overlay marks 919 on the second layer 116 forms the indication for positioning the overlay. The difference in the thickness of the non-transparent film material due to the window 125 in the metallization layer 119 can be used to provide contrast balance between the inner overlay marks 208 and the outer overlay marks 919. Regarding FIG. 4, the size of the window 125, which determines the thickness of the metallization layer 119, can be chosen to selectively tune the contrast balance between the inner overlay marks 208 and the outer overlay marks 919. The contrast and the intensity of the alignment signals are enhanced with thinner portions of the metallization layer 119. However, the quality of the inner overlay marks 208 is better without the metallization layer 119 and the quality of the outer overlay marks 919 is better with the metallization layer 119.

Figure 10:
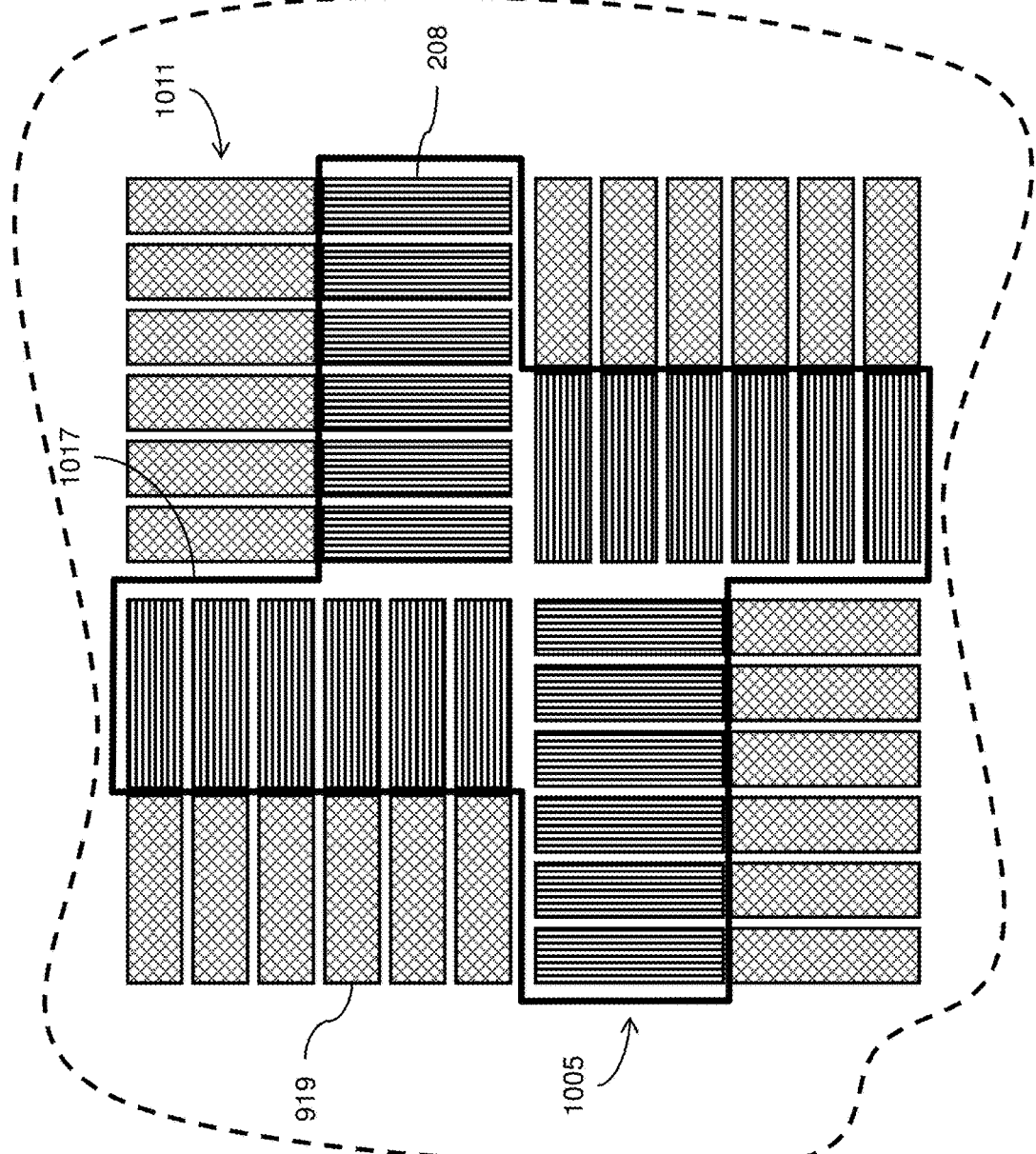
FIG. 10 is a top view of a portion of a layer of the multi-layer structure showing overlay marks according to devices and methods herein.
Figure 11:
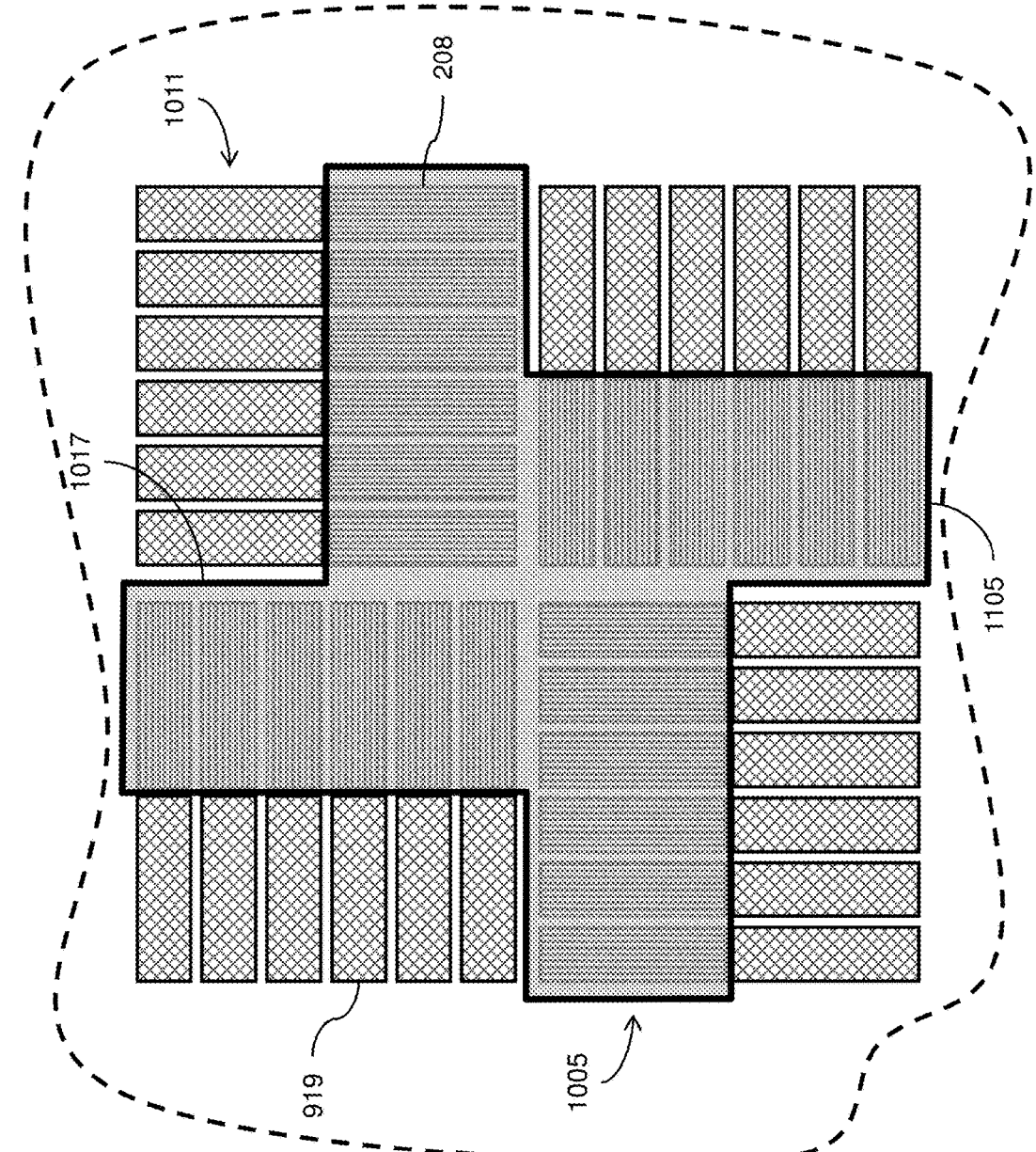
FIG. 11 is the top view of the portion of a layer of the multi-layer structure with a mask applied according to devices and methods herein.

Referring to FIG. 10, the inner overlay marks 208 and the outer overlay marks 919 may be formed in different zones of the multi-layer stack 101. According to devices and methods herein, zones may include a first zone 1005 having inner overlay marks 208 and a second zone 1011 having outer overlay marks 919. The area of the first zone 1005 is indicated in FIGS. 10 and 11 by the line 1017. Note the inner overlay marks 208 and outer overlay marks 919 are not on the same layer of the multi-layer stack 101. That is, the first zone may be located in the first layer 110 and the second zone may be located in the second layer 116. Further, the inner overlay marks 208 and outer overlay marks 919 may be made of different material. For example, the inner overlay marks 208 may be made of a hardmask material or metal (e.g., SiON+TiN+Sac SiN) and the outer overlay marks 919 may be on photoresist material.

In order to improve the contrast signals from the overlay marks, the contrast intensity between the inner overlay marks 208 and the outer overlay marks 919 can be selectively tuned by controlling the material thickness of the metallization layer 119. Referring to FIG. 11, according to devices and methods herein, a patterned photoresist 1105 can be formed in the metallization layer 119 over a preselected area of the first zone 1005. The patterned photoresist 1105 can constitute a mask applied to the structure in order to remove a portion of the metallization layer 119 above the first zone 1005. The mask can be formed of any suitable material, whether now known or developed in the future, such as a metal or organic or inorganic (Si3N4, SiC, SiO2C (diamond)) hardmask, that has etch resistance greater than the materials used in the remainder of the structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process can then be performed (e.g., plasma etching, etc.) to remove the unprotected portions of the material to be patterned. The resist is subsequently removed to leave the underlying material patterned according to the light exposure pattern.

Figure 12:
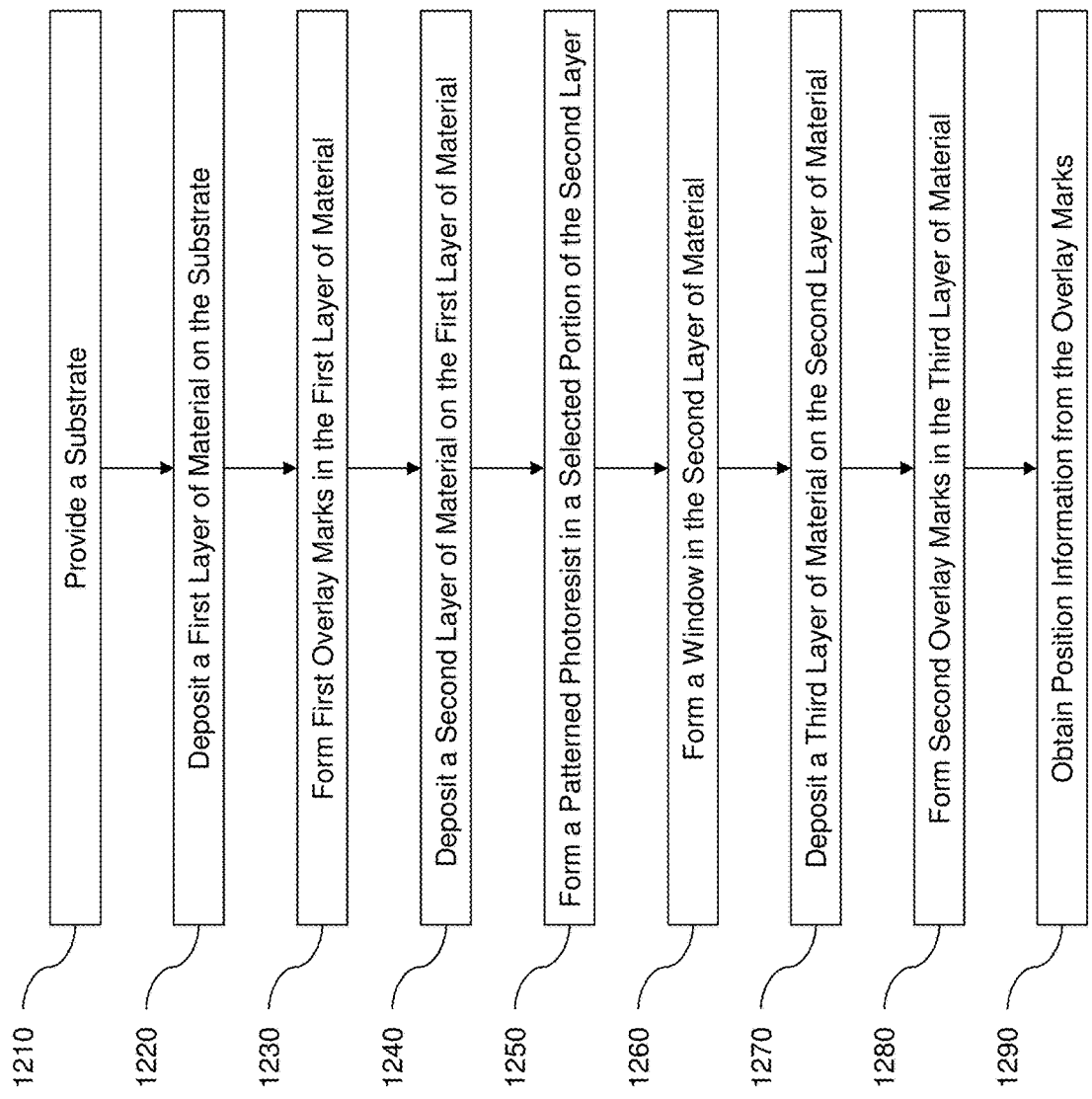
FIG. 12 is a flow diagram illustrating methods herein.

FIG. 12 is a flow diagram illustrating the processing flow of an exemplary method to improve overlay performance in semiconductor devices, such as described above. At 1210, a substrate is provided (e.g., a bulk silicon substrate or any other suitable semiconductor substrate). The substrate has a top surface and a bottom surface. A first layer of material is deposited on the top surface of the substrate, at 1220. The first layer of material has a top surface and a bottom surface, and the bottom surface of the first layer of material contacts the top surface of the substrate. At 1230, first (inner) overlay marks are formed in a first zone of the first layer of material. One of more first intermediate layers may be formed or deposited on the first layer of material. At 1240, a second layer of material is formed on the first layer of material (or first intermediate layers). The second layer of material has a top surface and a bottom surface, and the bottom surface of the second layer of material contacts the top surface of the first layer of material. The second layer of material is a non-transparent material that covers the first zone. At 1250, a patterned photoresist is formed on the second layer of material over a preselected portion of the first zone. At 1260, a window is formed in the second layer of material by selectively removing a portion of the second layer of material from only the portion of the area above the first zone that is not protected by the patterned photoresist. An etching process may be used to remove the portion of the second layer of material. This provides optical access to the inner overlay marks. A third layer of material is deposited on the top surface of the second layer, at 1270. The third layer of material has a top surface and a bottom surface, and the bottom surface of the third layer of material contacts the top surface of the second layer of material. Before forming the third layer, one of more second intermediate layers may be formed or deposited on the second layer of material. Further, the window may be formed in any layer of the first intermediate layers or the second intermediate layers. At 1280, second (outer) overlay marks are formed in a second zone of the third layer of material. Position information is obtained from each of the inner overlay marks and the outer overlay marks, at 1290. The inner overlay marks and the outer overlay marks are used to align structural features on the substrate by balancing optical contrast intensity between the inner overlay marks and the outer overlay marks. An overlay accuracy of structural features formed above the substrate may be determined based upon the obtained position information.

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises", "comprising", "includes", and "including", when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

While various examples are described herein, it will be appreciated from the specification that various combinations of elements, variations, or improvements therein may be made by those skilled in the art, and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the devices and methods herein, but that the devices and methods will include all features falling within the scope of the appended claims.

What is claimed is:

1. A method, comprising:
   forming a first layer of a multilayer device on a substrate;
   forming first overlay marks in a first zone of the first layer;
   forming first intermediate layers on top of the first layer of the multilayer device and the first overlay marks;
   forming a non-transparent layer on top of the first intermediate layers;
   forming a window in the non-transparent layer by removing only a portion of the non-transparent layer from a preselected area of the non-transparent layer, wherein the preselected area is vertically aligned on the first zone of the first layer and the window provides optical access to the first overlay marks;
   forming second intermediate layers on top of the window and the non-transparent layer;
   forming a second layer on top of the second intermediate layers and the window;
   forming second overlay marks in a second zone of the second layer; and
   obtaining position information from each of the first overlay marks and the second overlay marks by balancing optical contrast intensity between the first overlay marks and the second overlay marks.

2. The method according to claim 1, wherein forming a window in the non-transparent layer comprises etching the non-transparent layer.

3. The method according to claim 2, further comprising:
   forming a patterned photoresist on the non-transparent layer on top of a preselected portion of the first zone of the first layer.

4. The method according to claim 3, further comprising:
   performing one or more lithographic processes on the non-transparent layer to remove a portion of the non-transparent layer from the preselected area vertically aligned with the preselected portion of the first zone of the first layer.

5. The method according to claim 1, further comprising:
   using the first overlay marks and the second overlay marks to position structural features on the substrate.

6. The method according to claim 5, further comprising:
   determining an overlay accuracy of structural features formed on the substrate based upon the position information obtained from each of the first overlay marks and the second overlay marks.

7. The method according to claim 1, wherein the first overlay marks and the second overlay marks have different patterns.

8. A method of forming a semiconductor device, comprising:
providing a substrate;
depositing a first layer of material on the substrate, the first layer of material having a top surface and a bottom surface;
forming first overlay marks in a zone of the first layer of material;
forming first intermediate layers on top of the first layer of material and the first overlay marks;
forming a layer of non-transparent material on top of the first layer of material and the first intermediate layers, the layer of non-transparent material having a top surface and a bottom surface, the bottom surface of the layer of non-transparent material contacting the top surface of the first intermediate layers, wherein the layer of non-transparent material covers the zone of the first layer of material;
forming a window in the layer of non-transparent material by selectively removing only a portion of the layer of non-transparent material, the area being vertically aligned with the zone of the first layer of material, wherein the window provides optical access to the first overlay marks;
forming second intermediate layers on top of the window and the non-transparent layer;
forming a second layer of material on top of the second intermediate layers and the window, the second layer of material having a top surface and a bottom surface, the bottom surface of the second layer of material contacting the top surface of the second intermediate layers;
forming second overlay marks in the second layer of material; and
using the first overlay marks and the second overlay marks to position structural features on the substrate by balancing optical contrast intensity between the first overlay marks and the second overlay marks.

9. The method according to claim 8, wherein forming a window in the layer of non-transparent material comprises etching the layer of non-transparent material.

10. The method according to claim 9, further comprising:
forming a patterned photoresist on the layer of non-transparent material on top of a preselected portion of the zone of the first layer of material.

11. The method according to claim 10, further comprising:
performing one or more lithographic processes on the layer of non-transparent material to remove a portion of the layer of non-transparent material from the area vertically aligned with the preselected portion of the zone of the first layer of material.

12. The method according to claim 8, further comprising:
obtaining position information from each of the first overlay marks and the second overlay marks.

13. The method according to claim 12, further comprising:
determining an overlay accuracy of structural features formed on the substrate based upon the position information obtained from each of the first overlay marks and the second overlay marks.

14. The method according to claim 8, wherein the first overlay marks and the second overlay marks have different patterns.

15. A method of forming a multilayer device, comprising:
forming a first layer of material on a substrate;
forming first overlay marks in a first zone of the first layer of material;
forming first intermediate layers on top of the first layer of material and the first overlay marks;
forming a layer of non-transparent material on top of the first layer of material and the first intermediate layers, wherein the layer of non-transparent material covers the first intermediate layers and the first zone of the first layer of material;
forming a window in the layer of non-transparent material by selectively removing only a portion of the layer of non-transparent material from a preselected area of the layer of non-transparent material, wherein the preselected area of the layer of non-transparent material is vertically aligned on the first zone of the first layer of material and the window provides optical access to the first overlay marks;
forming second intermediate layers on top of the window and the layer of non-transparent material;
forming a second layer of material on top of the second intermediate layers and the window; the second layer of material having a top surface and a bottom surface, the bottom surface of the second layer of material contacting the top surface of the second intermediate layers;
forming second overlay marks in a second zone of the second layer of material; and
positioning structural features on the substrate by balancing optical contrast intensity between the first overlay marks and the second overlay marks.

16. The method according to claim 15, further comprising:
obtaining position information from each of the first overlay marks and the second overlay marks.

17. The method according to claim 16, further comprising:
determining an overlay accuracy of structural features formed on the substrate based upon the position information obtained from the first overlay marks and the second overlay marks.

18. The method according to claim 15, wherein the first overlay marks and the second overlay marks have different patterns.

19. The method according to claim 15, further comprising:
forming a patterned photoresist on the layer of non-transparent material on top of the preselected area of the first zone of the first layer of material.

20. The method according to claim 19, further comprising:
performing one or more lithographic processes on the layer of non-transparent material to form the window in the layer of non-transparent material.

* * * * *